United States Patent [19]

Mandai et al.

[11] Patent Number: 5,009,744
[45] Date of Patent: Apr. 23, 1991

[54] METHOD OF MANUFACTURING LAMINATED CERAMIC ELECTRONIC COMPONENT

[75] Inventors: Harufumi Mandai; Yukio Tanaka; Shinichi Takakura; Takuji Nakagawa, all of Kyoto, Japan

[73] Assignee: Murata Manufacturing Co., Ltd., Japan

[21] Appl. No.: 311,097

[22] Filed: Feb. 15, 1989

[51] Int. Cl.$^5$ ............................................. C23F 1/00
[52] U.S. Cl. ........................................ 156/656; 65/23; 29/423; 156/233; 156/541; 156/89
[58] Field of Search ............... 65/23; 156/89, 35, 541, 156/542, 230, 233, 234; 29/423

[56] References Cited

U.S. PATENT DOCUMENTS

| | | | |
|---|---|---|---|
| 4,089,733 | 5/1978 | Zimmerman | 156/656 |
| 4,328,530 | 5/1982 | Bajorek et al. | 361/309 |
| 4,366,342 | 12/1982 | Breedlove | 357/70 |
| 4,495,232 | 1/1985 | Bauser et al. | 156/230 |
| 4,510,000 | 4/1985 | Kumar | 156/89 |
| 4,733,292 | 3/1988 | Jarvis | 156/656 |
| 4,869,767 | 9/1989 | Robinson et al. | 156/233 |
| 4,929,295 | 5/1990 | Kohno et al. | 156/230 |

FOREIGN PATENT DOCUMENTS 62-161560 7/1987 Japan .
62-20832 8/1988 Japan .
62-200605 2/1989 Japan .

*Primary Examiner*—Kenneth M. Schor
*Assistant Examiner*—John J. Bruckner
*Attorney, Agent, or Firm*—Ostrolenk, Faber, Gerb & Soffen

[57] ABSTRACT

A metal film (12) for providing internal electrodes (22) is formed on a back film (11) made of a material such as polyethylene terephthalate by a thin film forming method such as vapor deposition or sputtering. A ceramic green sheet (14) is prepared. Then the metal film (12) is transferred onto the green sheet from the back film (11). In order to form the metal film (12) to be transferred into prescribed patterns, the metal film (12) may be partially removed from the back film (11) to leave only specific parts which are correlative with the prescribed patterns. Alternatively, only specific parts, which are correlative with the prescribed patterns, of the back film (11) may be pressed against the ceramic green sheet (14). A plurality of such ceramic green sheets (14), onto which the parts of the metal films (12) are transferred, have been stacked with each other.

4 Claims, 2 Drawing Sheets

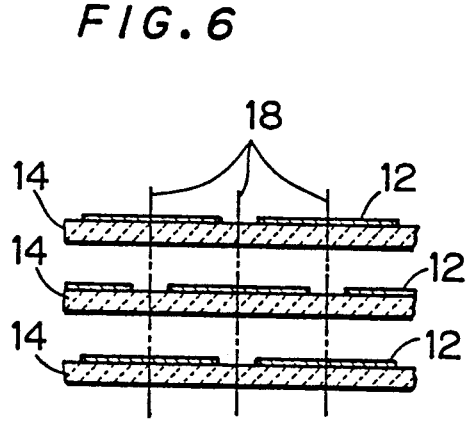
FIG.6
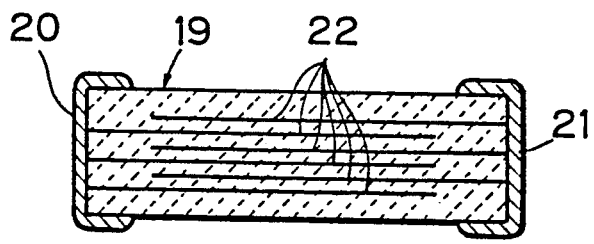
FIG.7
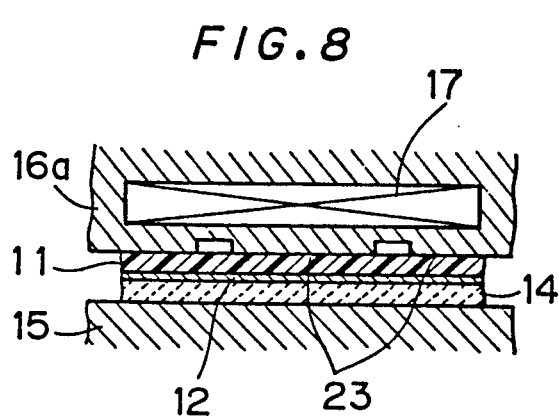
FIG.8
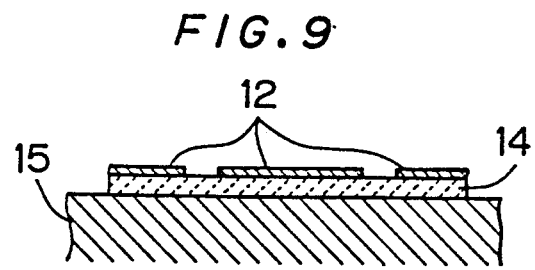
FIG.9
FIG.10
PRIOR ART
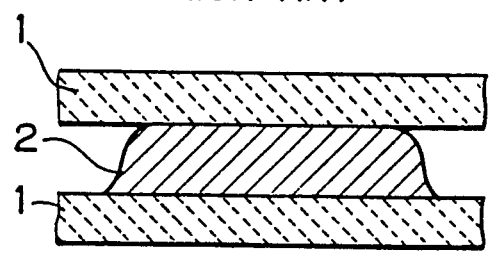

METHOD OF MANUFACTURING LAMINATED CERAMIC ELECTRONIC COMPONENT

BACKGROUND OF THE INVENTION

1. Field of the Invention

The present invention relates to a method of manufacturing a laminated ceramic electronic component such as a laminated ceramic capacitor, and more particularly, it relates to a method of manufacturing a laminated ceramic electronic component, which is characterized in a method of forming internal electrodes.

2. Description of the Background Art

In general, a laminated ceramic capacitor is manufactured through the following steps:

First, ceramic green sheets, which are shaped by a doctor blade method or the like, are prepared and paste containing a metal such as palladium, silver-palladium or nickel, for example, is screen-printed on each ceramic green sheet in prescribed patterns, for forming internal electrodes. Such ceramic green sheets are generally cut in a later step to obtain a plurality of laminated ceramic capacitors. Therefore, the paste for forming internal electrodes is distributed in a plurality of portions on each ceramic green sheet.

Then, a plurality of such ceramic green sheets, which are provided with metal paste members, are stacked and pressed to be brought into contact with each other. Thereafter such a laminate is cut to obtain chips for respective laminated ceramic capacitors.

Then each chip is fired. Thereafter metal paste is applied to prescribed outer surface regions of the chip to provide external electrodes, and then fired. Thus, a laminated ceramic capacitor is completed.

In order to obtain large capacitance in a laminated ceramic capacitor with reduction in size, the distance between each pair of internal electrodes, which are opposite to each other along the direction of stacking, is reduced. The thickness of a ceramic layer provided between each pair of opposite internal electrodes may be reduced to attain such an object. However, when the thickness of such a ceramic layer is simply reduced, the ratio of an internal electrode 2 to a ceramic layer 1 in thickness is increased, as typically shown in FIG. 10. Even if the thickness of the ceramic layer 1 can be reduced to about 5 to 10 $\mu$m, for example, that of the internal electrode 2, which is formed by screen printing as hereinabove described, is still maintained at about 6 to 10 $\mu$m.

Thus, it is difficult to stack and compress such ceramic layers 1, which are in the state of ceramic green sheets provided with metal paste layers of prescribed patterns for forming the internal electrodes 2. This is because the metal paste layers for forming the internal electrodes 2, which are only partially provided on the interfaces between the pairs of adjacent ones of the ceramic green sheets, make such a stacked body irregular in thickness along the surface direction of the stacked body.

When the ceramic chip is fired, on the other hand, shrinkage of the ceramic layers is extremely influenced by that of the metal paste layers, to cause cracking, non uniform firing shrinkage and the like.

Further, the metal paste layers contain a solvent, which swells or dissolves the ceramic green sheets to cause short-circuiting across the internal electrodes, reduction in voltage resistance and the like. Thus, problems are caused in reliability and quality.

SUMMARY OF THE INVENTION

Accordingly, an object of the present invention is to provide a method of manufacturing a laminated ceramic electronic component such as a laminated ceramic capacitor, which can advantageously solve the aforementioned problems even if ceramic layers provided between opposite pairs of internal electrodes for serving as dielectric members are reduced in thickness.

In order to solve the aforementioned problems, the method of manufacturing a laminated ceramic electronic component according to the present invention comprises:

(a) a step of forming a metal film for providing an internal electrode on a back film by a thin film forming method;

(b) a step of preparing a ceramic green sheet;

(c) a step of transferring a part of the metal film onto the ceramic green sheet from the back film in a prescribed pattern; and (d) a step of stacking a plurality of such ceramic green sheets onto which the metal film parts are transferred.

In a preferred embodiment of the present invention, vapor deposition or sputtering is employed as the above described thin film forming method.

The step of transferring the metal film part in a prescribed pattern is typically carried out in one of the following two modes: In a first mode, the metal film formed on the back film is previously treated to have the prescribed pattern on the back film, by removing a part of the metal film except for a specific part which is correlative with the prescribed pattern, and then transferred. In a second mode, a specific part, which is correlative with the prescribed pattern, of the back film is pressed in a step of actually transferring the metal film, so that only a pressed part of the metal film is transferred.

According to the present invention, a metal film for providing an internal electrode is first formed not on a ceramic green sheet but on a back film which is prepared from resin such as polyethylene terephthalate, for example. Such a back film is easy to handle as compared with a ceramic green sheet, and hence a thin film forming method can be readily employed in order to form the metal film on the same. Thus, it is possible to form an extremely thin metal film of about 0.2 to 2.0 $\mu$m, for example.

The aforementioned metal film can be easily formed even on a thinned ceramic green sheet, which is hard to handle due to reduction in thickness, through a transfer technique. Thus, the thickness of a ceramic layer provided between each pair of internal electrodes can be easily reduced, whereby the number of internal electrodes and ceramic layers to be stacked can be increased while avoiding increase in size. Consequently, a small laminated ceramic electronic component having large capacitance can be obtained.

In the aforementioned process for attaining multilayer structure, no difficulty is caused in stacking and compressing steps by thickness of metal paste layers for providing internal electrodes, dissimilarly to the prior art. Also, no bad influence is exerted on the ceramic layers by shrinkage of such metal paste layers in the firing step, so there are no problems such as cracking and not uniform firing shrinkage. Further, the ceramic green sheets are not swollen or dissolved by the solvent contained in the metal paste layers according to the conventional method, to cause no short-circuiting across internal electrodes or reduction in voltage resistance. Thus, a highly reliable laminated ceramic electronic component can be obtained.

The metal film according to the present invention contains no combustion component such as varnish, which has been contained in the conventional metal paste member. Upon firing, therefore, the internal electrodes are extremely dense as compared with those in the conventional case, whereby a laminated ceramic electronic component having small equivalent series resistance, i.e., small loss, can be obtained. Further, the inventive method can also suppress delamination which may be caused between fired ceramic layers by combustion of a combustion component in the firing step, to obtain a highly reliable laminated ceramic electronic component.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 7 illustrate an embodiment of the present invention, in which:

FIG. 1 is a sectional view showing a back film 11 which is provided with a metal film 12, FIG. 2 is a sectional view showing a state of the metal film 12 provided in a prescribed pattern by a resist film 13, FIG. 3 is a sectional view showing a step of removing the resist film 13 shown in FIG. 2, FIG. 4 is a plan view showing the back film 11 provided with metal film parts 12 formed in a plurality of patterns in the step shown in FIG. 3, FIG. 5 is a sectional view showing a step of transferring the metal film parts 12 onto a ceramic green sheet 14, FIG. 6 shows a step of stacking ceramic green sheets 14 having transferred metal film parts 12 and cutting the same, and FIG. 7 is a sectional view showing a laminated ceramic capacitor thus obtained;

FIGS. 8 and 9 are adapted to illustrate another embodiment of the present invention, in which:

FIG. 8 is a sectional view showing a step of transferring specific parts of a metal film 12 onto a ceramic green sheet 14, and FIG. 9 is a sectional view showing a state of the ceramic green sheet 14 onto which the metal film parts 12 have been transferred in prescribed patterns; and FIG. 10 is an enlarged view schematically showing a stacked state of ceramic layers 1 between which an internal electrode 2 is interposed, for illustrating problems of the background art.

DESCRIPTION OF THE PREFERRED EMBODIMENTS

FIGS. 1 to 7 are adapted to illustrate an embodiment of the present invention, which is directed to a method of manufacturing a laminated ceramic capacitor.

Figure 1:

FIG. 1 is an enlarged sectional view partially showing a back film 11 of 20 to 100 μm in thickness, which is prepared from polyethylene terephthalate or the like. The back film 11 may be formed of another material which is not deformed at a temperature of about 100° to 150° C., in place of the aforementioned polyethylene terephthalate.

A metal film 12 of a metal such as palladium, silver-palladium, nickel, copper or the like is formed on the back film 11 by a thin film forming method, to provide internal electrodes. Examples of the thin film forming method are sputtering, vapor deposition and the like. The thickness of the metal film 12 is about 0.2 to 2.0 μm. This metal film 12 is to be transferred onto a ceramic green sheet from the back film 11 in a later step. Therefore, separation processing such as silicone coating is preferably performed on the surface of the back film 11, in order to control adhesion of the metal film 12 to the back film 11.

Figure 2:
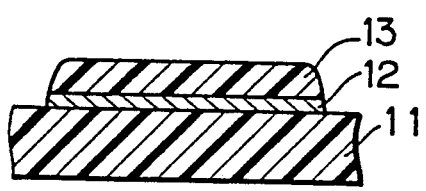

Then, as shown in FIG. 2, a resist film 13 is partially formed on the metal film 12 by screen printing, for example, and thereafter parts of the metal film 12 are removed to leave only those covered with the resist film 13, by acid treatment with nitric acid or the like. The resist film 13 has patterns which are correlative with prescribed patterns for the internal electrodes to be provided by the metal film 12.

Figure 3:
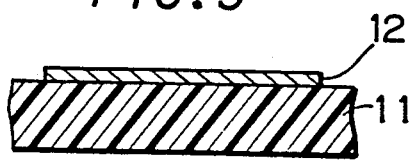

Then, as shown in FIG. 3, the resist film 13 is removed by an organic solvent, to leave the metal film parts 12 having the prescribed patterns on the back film 11.

Figure 4:
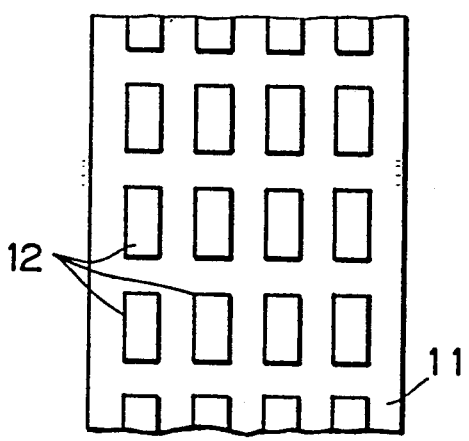

Thus, metal film parts 12 are provided on a single back film 11 in a plurality of patterns, as shown in FIG. 4.

In the aforementioned step shown in FIG. 2, the resist film 13 may not be formed by screen printing, but an optical-hardening type resist film and optical exposure may be employed to form the patterns corresponding to the internal electrodes. In this case, unhardened parts of the resist film are removed and then the metal film 12 is partially removed to leave only specific parts which are correlative with the prescribed patterns.

Figure 5:
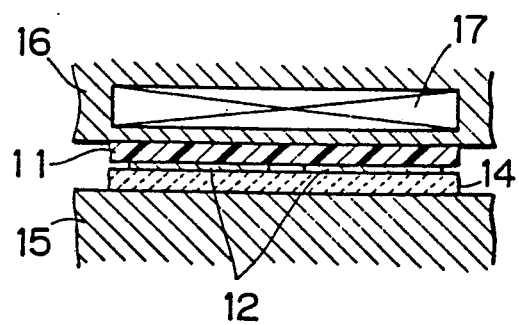

Then, the metal film parts 12 are transferred onto a ceramic green sheet 14, as shown in FIG. 5. The ceramic green sheet 14 is placed on a lower die 15. Then the back film 11 is so placed as to bring the metal film parts 12 into contact with the ceramic green sheet 14, and pressed by an upper die 16. The upper die 16, which comprises a heater 17, presses the back film 11 against the ceramic green sheet 14 under pressure of 20 to 500 kg/cm$^2$, while heating the back film 11 at a temperature of about 100° to 150° C. Thus, the metal film parts 12 provided on the back film 11 are transferred onto the ceramic green sheet 14.

FIG. 6 shows a plurality of ceramic green sheets 14, onto which metal film parts 12 have been transferred. An arbitrary number of such ceramic green sheets 14 are stacked, while aligning the metal film parts 12 formed thereon in a desired manner, brought into pressure contact with each other, and then cut along positions shown by one-dot chain lines 18. Referring to FIG. 6, the ceramic green sheets 14 and the metal films 12 are exaggerated along the direction of thickness as compared with the intervals between the one-dot chain lines 18.

Each chip obtained in the aforementioned manner is fired similarly to the conventional method of manufacturing a laminated ceramic capacitor, to implement a chip 19 shown in FIG. 7. Then, external electrodes 20 and 21 are formed on both end portions of the chip 19 by applying metal paste and baking the same, for example. Thus, a laminated ceramic capacitor is obtained. Referring to FIG. 7, a plurality of internal electrodes 22 are provided in the chip 19 by the aforementioned metal film parts 12.

FIGS. 8 and 9 are adapted to illustrate another embodiment of the present invention. According to this embodiment, a back film 11 provided with a metal film 12 is first obtained in a step similar to that shown in FIG. 1. The metal film 12 is not divided into prescribed patterns, but is directly brought into a transferring step. Therefore, the feature of this embodiment resides in an upper die 16a, which is employed in the transferring step as shown in FIG. 8.

Referring to FIG. 8, the back film 11, which is entirely or substantially entirely provided with the metal film 12, is placed on a ceramic green sheet 14 held on a lower die 15, so that the metal film 12 is in contact with the ceramic green sheet 14. The upper die 16a for thermally transferring the metal film 12 is provided with projections 23 having configurations which are correlative with prescribed patterns required for internal electrodes. Thus, parts of the back film 11 corresponding to the projections 22 are so pressed that only pressed parts of the metal film 12 are transferred onto the ceramic green sheet 14.

FIG. 9 shows the state of finishing such transferring. Referring to FIG. 9, only specific parts of the metal film 12 have been transferred onto the ceramic green sheet 14.

Subsequent steps of this embodiment are similar to those of the aforementioned embodiment, and hence redundant description is omitted.

In the method according to the present invention, the steps of stacking ceramic green sheets may be carried out to stack ceramic green sheets provided with no metal film parts, in addition to those provided with the metal film parts.

Further, the step of transferring the metal film parts onto the ceramic green sheet from the back film in prescribed patterns may be performed on a plurality of ceramic green sheets which are previously stacked with each other.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a laminated ceramic electronic component having internal electrodes formed in a pattern, comprising the steps of:
   forming a metal film on a back film by a thin film forming method;
   removing part of said metal film from said back film to leave only specific parts of said metal film on said back film, said specific parts being arranged on said back film in an arrangement which corresponds to said internal electrode pattern to be formed on said ceramic green sheet; and
   providing a ceramic green sheet for receiving said metal film;
   transferring said metal film parts onto said ceramic green sheet from said back film to form said internal electrodes by contacting the green sheet with the back film/metal film component such that the metal film is transferred to the green sheet;
   stacking a plurality of said ceramic green sheets on which respective said internal electrodes have been formed to thereby form said laminated ceramic electronic component having internal electrodes formed in a pattern.

2. A method of manufacturing a laminated ceramic electronic component in accordance with claim 1, wherein said thin film forming method is selected from the group consisting of vapor deposition and sputtering.

3. A method of manufacturing a laminated ceramic electronic component in accordance with claim 1, wherein the thickness of said metal film is approximately from 0.2 to 2.0 μm.

4. A method of manufacturing a laminated ceramic electronic component in accordance with claim 1, wherein said step of removing part of said metal film from said back film includes the steps of:
   forming a resist film on parts of said metal film corresponding to said specific parts of said metal film to be left on said back film; and
   applying a removing agent to said metal film so as to remove all parts thereof that do not have said resist film formed thereon.

* * * * *